United States Patent [19]

Dietz

[11] 4,142,203

[45] Feb. 27, 1979

[54] METHOD OF ASSEMBLING A HERMETICALLY SEALED SEMICONDUCTOR UNIT

[75] Inventor: Raymond L. Dietz, Poway, Calif.

[73] Assignee: AVX Corporation, Great Neck, N.Y.

[21] Appl. No.: 752,545

[22] Filed: Dec. 20, 1976

[51] Int. Cl.² .................... H01L 39/02; H01L 23/48; H01L 29/44

[52] U.S. Cl. .......................... 357/80; 357/67; 357/74; 357/72; 357/73

[58] Field of Search ............ 357/67, 71, 72, 73, 357/74, 80

[56] References Cited

U.S. PATENT DOCUMENTS

| | | | |
|---|---|---|---|
| 3,271,635 | 9/1966 | Wagner | 357/67 |
| 3,317,653 | 5/1967 | Layer et al. | 357/73 |
| 3,428,866 | 2/1969 | Chiou et al. | 357/74 |
| 3,435,516 | 4/1969 | Kilby | 357/80 |
| 3,497,774 | 2/1970 | Hornberger | 357/67 |
| 3,535,486 | 10/1970 | Wood | 357/74 |
| 3,549,782 | 12/1970 | Reifel | 357/72 |
| 3,593,412 | 7/1971 | Foote | 357/71 |
| 3,617,819 | 11/1971 | Boisvert | 357/74 |
| 3,622,419 | 11/1971 | London | 357/72 |
| 3,691,289 | 9/1972 | Rohloff | 357/72 |
| 3,793,064 | 2/1974 | Budd et al. | 357/80 |
| 4,024,567 | 5/1977 | Iwata et al. | 357/67 |
| 4,027,236 | 5/1977 | Kummer et al. | 357/67 |

Primary Examiner—Andrew J. James
Attorney, Agent, or Firm—Arthur B. Colvin

[57] ABSTRACT

Hermetically sealed unit containing an integrated circuit metal oxide semi-conductor chip, wherein a single layer gold-silver alloy serves both to secure the chip within the unit and to form a proper junction with the aluminum alloy conductor connected to a circuit element in said chip. A sufficient proportion of silver is included in the gold-silver alloy whereby said junction retains requisite operational characteristics of bond strength and low resistivity when said unit is subjected to heat for providing a hermetic seal therefor.

10 Claims, 5 Drawing Figures

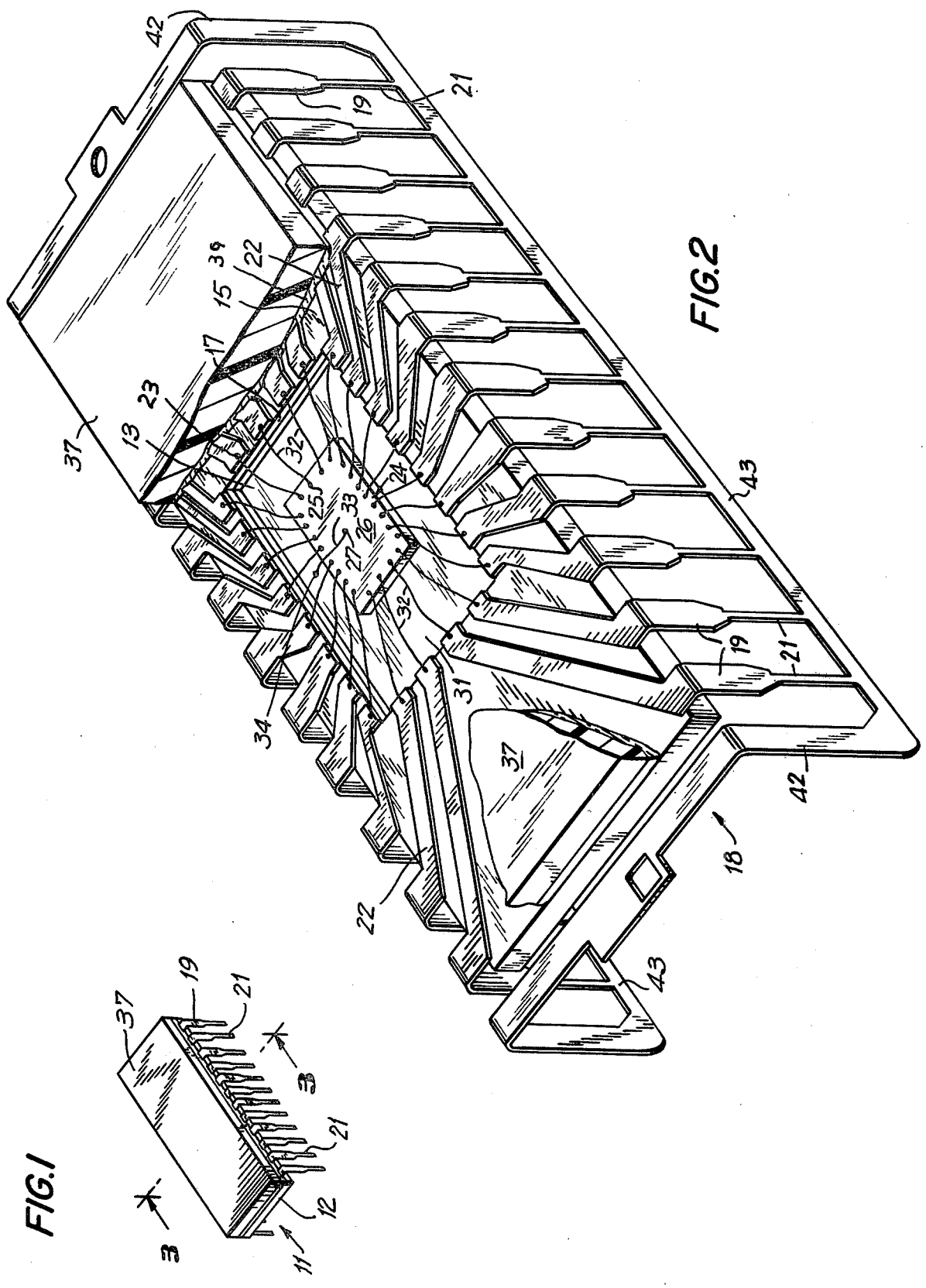

METHOD OF ASSEMBLING A HERMETICALLY SEALED SEMICONDUCTOR UNIT

The present invention relates to semi-conductors, and more particularly to an improved method and system for assembling and incorporating an integrated circuit (IC) metal oxide semi-conductor (MOS) unit in an electronic component package.

The invention accomplishes the objectives of reducing labor and other cost factors in producing integrated circuit sub-assemblies for subsequent use in multiple units circuitry and of insuring against structural and functional failures of the IC MOS packages caused by previous production processes.

The present invention overcomes the problem previously encountered when attempts were made to connect an aluminum alloy wire between the MOS chip and the gold layer on the floor of the substrate cavity for the purpose of providing a reference level for operation of the chip by means of reverse biasing. This resulted in the excessive and undesirable gold-aluminum intermetallics of high resistivity at the junction areas, thereby deleteriously affecting the electrical output characteristics of the chip. Also, because these intermetallics were highly brittle, breakage at the junction would occur because of mechanical shock due to vibration or because of thermal shock due to rapid temperature changes.

In a prior assembly process the MOS chip was positioned within the cavity of a ceramic substrate whereby the chip was mounted on the surface of a layer or film of gold spread on the cavity floor, and die-attached thereto by application of heat and pressure to form a eutectic bond. An aluminum alloy connecting wire was bonded to the top of the chip and to the gold layer in order to establish the aforementioned reference level. During subsequent processing, however, when it was necessary to seal the ceramic package at a higher temperature, the aluminum alloy wire connection to the gold layer developed intermetallic characteristics which caused consequent undesirable brittleness and deleteriously affected the electrical characteristics of the final product.

An attempt to circumvent this problem involved the substitution of a so-called double metallization method. By this means an initial layer of silver is first dotted upon the cavity floor and then fired to form an evenly distributed coating thereon. Subsequently, a gold "preform" is positioned upon the silver and the semiconductor chip is eutectic bonded to the gold which when molten as a eutectic also bonds to the underlying silver layer. Thus, instead of die-attaching the MOS chip to a single gold layer on the cavity floor, it has been the practice to provide such double metalization method and then bond the aluminum alloy wire to the underlying silver layer which does not form any detrimental intermetallics with the aluminum alloy wire.

There are several drawbacks to the above-described prior art method for the following reasons:
1. The double metalization incurs a higher material cost to the semiconductor industry.
2. The labor costs are high in the assembly process since the conventional automatic die-attach machine cannot handle the additional gold preform which must be applied upon the underlying silver layer or film on the cavity floor. Hence, the preform elements must be applied by hand whereby labor costs are manifestly increased.
3. Production through-put is reduced by about 50% since the automatic die-attach machine cannot be utilized.

It appears, therefore, that the present invention which now provides for a single metalization system whereby the component materials can be die-attached and bonded directly to a single layer gold-silver alloy on the cavity floor without encountering the intermetallics problem overcomes the disadvantages and deficiencies of the prior art method. The novel method of the present invention obviates the prior separate hand manipulation of a gold preform, and now permits the use of an automatic die-attach machine, whereby considerable labor and time savings to the semi-conductor industry can be realized.

In the accompanying drawings in which are shown one of various embodiments of the several features of the invention:

FIG. 1 is an external perspective view of the semiconductor unit in enlarged proportions, illustrating the assembly of the ceramic enclosure for the integrated circuit chip and showing the descending pins which provide for the incorporation thereof into other accommodating electronic instrumentation or apparatus;

FIG. 2 is a greatly enlarged perspective view of the unit shown in FIG. 1, with some parts being broken away, and with the frame assembly prior to the trimming away of some structural parts before arriving at the final product shown in FIG. 1;

Figure 3:
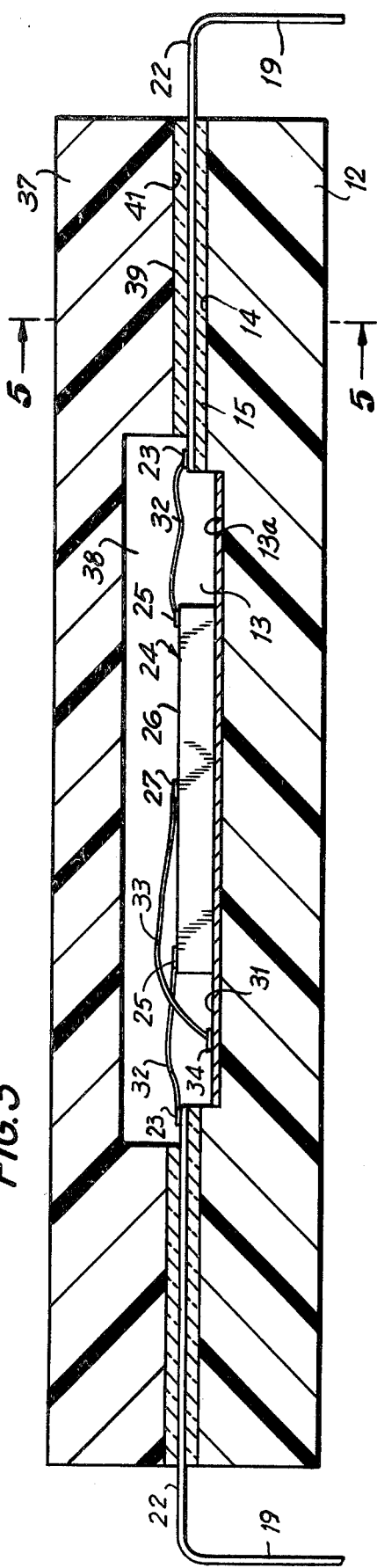
FIG. 3 is a further greatly enlarged view of the device taken on line 3—3 of FIG. 1. This view shows in exaggerated dimension the layer of sealing glass that is located between the opposing surfaces of the ceramic base and the ceramic lid after the MOS chip has been hermetically sealed within the cavity formed between the base and the lid.
Figure 5:
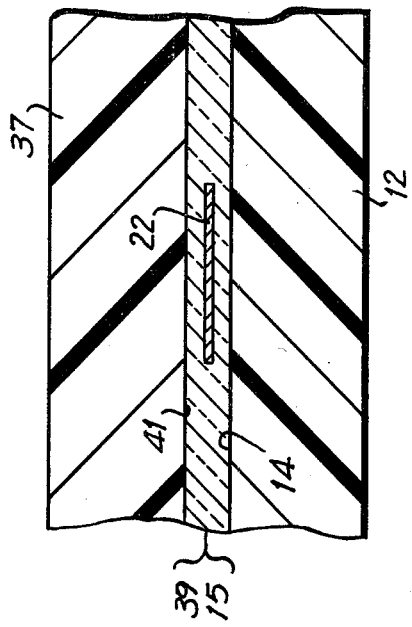
FIG. 5 is a view similar to FIG. 4 showing the assembly of the base and the lid after they have been sealed and fused together with a lead tab hermetically embedded within the glass layer.
Figure 4:
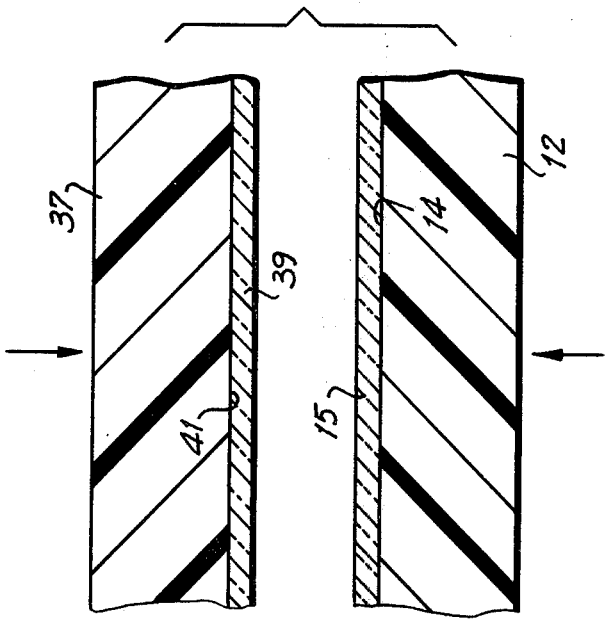
FIG. 4 is a further enlarged exploded fragmentary section view showing the spaced apart base and lid coated with the softened glass layers.

Referring now to the drawings in detail, the IC MOS unit, generally designated 11, comprises a rectangular ceramic base 12 of conventional type made of aluminia (aluminum oxide). Base 12, as shown in FIG. 3, has a rectangular recess 13 in the center thereof. The top surface 14 of the base 12 in the process of manufacture, has a glass coating 15 thereon. It is to be noted, as shown in FIG. 2, that the glass coating 15 extends to the periphery 16 of the recess 13.

The assembly of unit 11 includes a lead frame, generally designated 18, of standard type and having a number of downwardly extending legs 19, the lower ends of which define pins 21, and the integrally formed upper ends of which define horizontally disposed connector tabs 22.

During an intermediate production step, described hereinafter, base 12 is heated to melt the glass coating 15 and pushed against the undersurfaces of tabs 22 so that the undersurfaces thereof become embedded in glass coating 15, while the upper surfaces of the inner end portions 23 of tabs 22 remain exposed and are devoide of glass coating.

A metal oxide semi-conductor (MOS) silicon chip 24, located centrally of recess 13 is of conventional type and has a plurality of spaced apart aluminum contact pads 25 on its top surface 26 in somewhat rectangular array and to which the separate internal circuit elements in the chip are respectively connected. The MOS chip 24 also has an additional aluminum connector pad 27 on its top surface which must be connected to the base of the chip to provide a reference point or reverse biasing means in order to insure proper electrical function of the device.

According to the present invention, the floor 13a of the recess 13 in base 12 has a film or coating layer 31 thereon and in intimate contact therewith. This coating, according to the invention, comprises an alloy containing silver and gold mixed with small portions of glass, organic and other ingredients. In one operative embodiment, the proportion of silver to gold is 5% to 95% approximately.

The silver-gold alloy and other ingredients are originally in a fine suspension and form a paste or dotting material.

In one formulation the dotting material is made by dispersing the gold, silver and glass powders in an organic vehicle by normal thick film methods. The mixture is dispersed further by a three roll mill, and Terpineol 318 is added to dilute it to 55% solids yielding the following formulation:

| Gold | 48.5% |
|---|---|
| Silver | 2.5% |
| Glass Powder | 4.0% |
| Ethyl Cellulose T-200 | 2.8% |
| Terpineol 318 | 42.2% |
| | 100.0% |

In manufacturing the unit, the foregoing dispersion is stirred and dotted into the MOS base recess 13, filling the latter full. The base is then dried at about 150° C. for about 10 minutes. Thereafter, the dried base 12 is then fired at 910° C. with a total cycle time of about 45 minutes. The organics are burned off at these temperatures leaving behind a composition as follows:

| Gold | 88.11% |
|---|---|
| Silver | 4.64% |
| Glass | 7.25% |
| | 100.0% |

The glass provides the adherence of the metal alloy phase to the ceramic base. The metal alloy consists of 95% gold, 5% silver.

After the unit has cooled, as indicated hereinabove, the fired base ceramic 12 is then printed with the low temperature sealing glass coating 15 and fired at about 450° C.

The glazed base 12 with the metallized recess is then heated to about 470° C. The lead frame 18 is then sunk into the now soft glaze 15 as previously described.

Thereupon, the MOS chip 24 is die-attached to film 31. This is done by applying heat and pressure to chip 24 while slightly moving it around to "scrub" the coated surface to cause the contiguous or bottom surface of the chip to become intimately embedded in the silver-gold alloy layer 31. The temperature used is approximately 450° C. to 470° C. which is not high enough to cause any damage to the components of the MOS chip. As a result of the applied heat and pressure, a proper and desired eutectic bond will be formed between the bottom surface of the MOS chip and the gold alloy in film 31.

Thereafter, each lead wire 32 made of a suitable aluminum alloy (mainly aluminum) is connected at one end to a circuit related aluminum pad 25 on chip 24, and at the other end to a corresponding tab end portion 23, which is aluminum clad. Lead wires 32 are connected to these respective circuit elements by ultrasonic bonding whereby heat effects are avoided.

In order to establish the requisite reference level for chip 24, one end of lead wire 33 is connected to aluminum pad 27 mounted on the top surface of said chip and connected to a suitable circuit element therein, while the other end of wire 33 is connected to pad 34 on film 31, said connections being accomplished by ultrasonic bonding.

A closure for the unit is provided by a cover or lid 37 of ceramic material identical to base 12 and with a recess 38 in the bottom surface thereof, and also having a glass coating 39 fired on its undersurface 41. Lid 37 is placed over and urged against the partially assembled base unit so that recess 13 and recess 38 form therebetween a unitary chamber or cavity. With the application of heat of approximately 500° C. glass coatings 15 and 39 coalesce and fuse to form a hermetically sealed enclosure for the IC MOS.

Thereafter, legs 42 and connector strip 43 are severed from lead frame 18 to complete unit 11 shown in FIG. 1.

The thrust of the present invention is directed to the problem encountered in the prior art when connecting a circuit in a MOS chip by way of a "down bond" lead 33 to a gold film on the floor of the cavity in which the chip is located in order to establish a reference level requisite for proper functioning of the integrated circuit.

Since aluminum wire is commonly used for lead 33 for connection to the gold film, it has been found that as a result of subjecting the assembly of base 12 and lid 37 to a temperature of about 500° C. to cause fusion of glass layers 15 and 39 to effect the hermetic seal, the formation of detrimental intermetallic compounds occur at junction 34 between the aluminum wire and the gold film.

The presence of excessive intermetallics results in a high resistivity at the junction which affects the electrical output characteristics of the chip, and will also result in breakage at the junction with mechanical shock due to vibration or thermal shock due to rapid temperature changes. In the prior art, these drawbacks were overcome by interposing a silver film between a gold "preform" and the recess floor, and then connecting the down bond lead to the silver film, involving a hand operation that approximately doubled the time consumed in producing the IC MOS module by means of a "double metallization" process. This also prevented the use of labor saving automatic apparatus that is operative for a far less costly single metalization process.

The present invention obviates the necessity for utilizing the double metallization process and permits the use of automatic "die-attach" apparatus for bonding the MOS chip to a single layer gold-silver alloy film on the floor of the base recess. At the same time the integrity of the junction between the "down-lead" aluminum wire and the gold-silver alloy film will be preserved against the formation of detrimental intermetallics. Because of the presence of the silver component in the single layer gold-silver alloy in the approximate proportions of 95% gold and 5% silver, not only will a proper eutectic bond form between the MOS chip and said layer, but also, when the glass to glass seal is effected at approximately 500° C., there will be no excessive intermetallics formed at the junction between the aluminum wire and said layer since the wire is essentially bonded to the silver component in the gold-silver alloy.

While the use of 95-5 gold-silver alloy has been found to produce satisfactory results, experiments have confirmed that the silver component in the alloy may range from about 4.5% to about 15% and exhibit acceptable operational characteristics of low resistivity and proper bond strength at the junction of the aluminum wire and the alloy film.

If the alloy composition were 2% silver and 98% gold, for example, although the eutectic bond of the MOS chip to the coating would take place at a low enough temperature to prevent injury to the chip, nevertheless when the subsequent fusion of the glass was effected at approximately 500° C., detrimental intermetallics would result at the junction 34 of the aluminum wire to the alloy layer 31 due to the excessive percentage of gold.

At the other extreme, if the alloy layer comprised 20% silver and 80% gold, eutectic bonding of the MOS chip to the alloy layer would require a temperature that would destroy the electronic components within the chip.

Having thus described my invention what I claim as new and desire to secure by Letters Patent of the United States is:

1. A single layer metallizing material for bonding an integrated circuit metal oxide semiconductor in a ceramic base comprising a dispersion having the formulation:

| | |
|---|---|
| Gold | 48.5% |
| Silver | 2.5% |
| Glass Powder | 4.0% |
| Ethyl Cellulose T-200 | 2.8% |
| Terpineol 318 | 42.2% |
| | 100.0% |

2. A single layer metallizing material for bonding an integrated circuit metal oxide semiconductor in a ceramic base comprising an alloy containing approximately 95% gold and approximately 5% silver.

3. A single layer metallizing material for bonding an integrated circuit metal oxide semiconductor in a ceramic base comprising a gold-silver alloy containing approximately 4.5% to 15% silver.

4. A component for an integrated circuit assembly comprising a ceramic base, a recess in said base, a single layer metallizing film bonded in said recess, said film comprising an alloy containing approximately 95% gold and approximately 5% silver.

5. In an integrated circuit assembly comprising a ceramic base having a recess formed therein, and a single layer metallizing film bonded in said recess to the base, said film comprising a gold-silver alloy containing approximately 4.5% to 15% silver.

6. The integrated circuit assembly of claim 5 including, a glass glaze on the surface of said base, said glaze being spaced apart from the periphery of said recess.

7. The integrated circuit assembly of claim 6 including comprising a ceramic base, a recess in said base, a glass glaze on the surface of said base, said glaze being spaced apart from the periphery of said recess, a single layer metallizing film bonded in said recess, said film comprising an alloy containing approximately 95% gold and approximately a lead frame secured firmly in said glass glaze.

8. A hermetically sealed integrated circuit assembly comprising a ceramic base, a recess in the top surface of said base, a ceramic lid cooperating with said base having a floor and when sealed therewith forming an enclosed cavity about said recess, a semi-conductor chip located in said cavity, a single layer of a gold-silver alloy composed of approximately 95% gold and approximately 5% silver, disposed on the floor of said cavity and in intimate contact therewith, a portion of said chip being in intimate contact with said layer, and an aluminum alloy wire conductor, one end of said conductor being connected to a circuit element in said chip, the other end of said conductor being connected to said layer, said layer having an alloy composition such that when said lid is hermetically bonded by a glass seal to said base by the application of heat to enclose said chip in said cavity, the integrity of the junction between the layer and said other conductor end is preserved against the formation of detrimental intermetallics.

9. A hermetically sealed integrated circuit assembly comprising a ceramic base, a recess in the top surface of said base, a ceramic lid cooperating with said base having a floor and when sealed therewith forming an enclosed cavity about said recess, a semi-conductor chip located in said cavity, a single layer of a gold-silver alloy containing approximately 4.5 to 15% silver, disposed on the floor of said cavity and in intimate contact therewith, a portion of said chip being in intimate contact with said layer, and an aluminum alloy wire conductor, one end of said conductor being connected to a circuit element in said chip, the other end of said conductor being connected to said layer, said layer having an alloy composition such that when said lid is hermetically bonded by a glass seal to said base by the application of heat to enclose said chip in said cavity, the integrity of the junction between the layer and said other conductor end is preserved against the formation of detrimental intermetallics.

10. A hermetically sealed integrated circuit assembly comprising a sealed enclosure having a chamber within said enclosure, a floor, a single layer of a gold-silver alloy applied directly to said floor and in intimate contact therewith, a metal oxide semi-conductor chip in said chamber, in intimate contact with said layer, an aluminum alloy wire conductor connecting said chip to said gold-silver layer, said layer including a predetermined proportion of silver for forming with said conductor a bonding junction which exhibits requisite operational characteristics of bond strength and low resistivity when the assembly has been subjected to heat for hermetically sealing said enclosure, said predetermined proportion of silver in the gold-silver alloy being approximately 4.5 to 15%.

* * * * *

UNITED STATES PATENT AND TRADEMARK OFFICE
CERTIFICATE OF CORRECTION

PATENT NO. : 4,142,203
DATED : Feb. 27, 1979
INVENTOR(S) : Raymond L. Dietz

It is certified that error appears in the above-identified patent and that said Letters Patent are hereby corrected as shown below:

COLUMN 6, lines 2-7: "comprising a ceramic base, a recess in said base, a glass glaze in the surface of said base, said glass glaze being spaced apart from the periphery of said recess, a single layer metallizing film bonded in said recess, said film comprising an alloy containing approximately 95% gold and approximately" should be deleted.

Signed and Sealed this

Twenty-first Day of September 1982

[SEAL]

Attest:

Attesting Officer

GERALD J. MOSSINGHOFF

Commissioner of Patents and Trademarks